United States Patent [19]

Mizuno et al.

[11] Patent Number: 5,624,499
[45] Date of Patent: Apr. 29, 1997

[54] CVD APPARATUS

[75] Inventors: Shigeru Mizuno, Kawasaki; Masahito Ishihara, Fuchu; Manabu Tagami, Fuchu; Hajime Sahase, Fuchu; Nobuyuki Takahashi, Mitaka, all of Japan

[73] Assignee: Anelva Corporation, Tokyo, Japan

[21] Appl. No.: 634,676

[22] Filed: Apr. 18, 1996

[30] Foreign Application Priority Data

Apr. 28, 1995 [JP] Japan .................... 7-129206

[51] Int. Cl.⁶ .................................. C23C 16/00
[52] U.S. Cl. .................. 118/725; 118/715; 118/728
[58] Field of Search .................. 118/715, 725, 118/728

[56] References Cited

U.S. PATENT DOCUMENTS 5,374,594 12/1994 van de Ven et al. ............ 437/247

FOREIGN PATENT DOCUMENTS 4-345022 12/1992 Japan.

*Primary Examiner*—Richard Bueker
*Attorney, Agent, or Firm*—Oliff & Berridge

[57] ABSTRACT

A CVD apparatus is equipped with a reactor, a substrate holder, an evacuation section, a reactive gas supply mechanism, a heating mechanism for heating the substrate holder, a differential pressure chuck clamping section for clamping the substrate, and a purge gas supply mechanism for supplying purge gas. The substrate holder is configured to have a circular purge gas blowing channel on the top surface thereof, in which a diameter of an outside wall-surface is less than a diameter of the substrate, and a plurality of purge gas passages in an inside thereof, each of which supplies the purge gas into the purge gas blowing channel. The purge gas passing the purge gas blowing channel is blown off through a clearance between the outer periphery of the substrate and the substrate holder. The purge gas passage includes a radius-directed part directed in a radius direction of the substrate holder and has a purge gas outlet provided on the outside wall-surface of the purge gas blowing channel. The flow of the purge gas in a circumferential direction within the purge gas blowing channel is turbulent and dispersed, and therefore the purge gas blow-off pressure in the whole periphery of the substrate is uniform.

27 Claims, 9 Drawing Sheets

CVD APPARATUS

BACKGROUND OF THE INVENTION

1. Field of the Invention

The present invention relates to a CVD apparatus, and more particularly, to a CVD apparatus in which a chemical vapor deposition process (CVD process) as one of the processes for manufacturing semiconductor devices is carried out. The CVD process is a method of depositing a thin film onto a substrate through chemical vapor phase growth.

2. Description of the Related Art

Recent manufacturing processes for semiconductor devices tends to advance integration and miniaturization of electronic circuit elements incorporated in the semiconductor devices. The miniaturization of the elements in the manufacturing process requires new techniques. For example, techniques for sufficiently filling fine holes with film, reducing the steps caused on the elements, reducing heat generation due to high current density, or preventing breaking of wires by electromigration are required. As one of the manufacturing processes meeting such technical requirements, in place of the sputtering process depositing an aluminum film, a thermal CVD (chemical vapor deposition) process attracts attention, which uses $WF_6$ (tungsten hexafluoride) gas and $H_2$ gas to deposit a blanket tungsten (W) film (hereinafter referred to as a "B-W film"). When such a B-W film is used, sufficient step coverage characteristics can be attained even for a hole with a diameter of 0.5 μm or less and an aspect ratio of 2 or more. Thus, the thermal CVD process can satisfy the above requirements such as for flattening of elements, and for prevention of breaking of wires by electromigration.

On the other hand, the manufacturing process of the semiconductor device recently requires the B-W film to be deposited on the entire surface of the substrate based on the following reasons.

In the conventional CVD apparatus, when a TiN film is deposited onto the substrate as an underlying film by sputtering, a field on which the TiN film is not deposited is formed at a place close to a periphery of the substrate, because the deposition of the TiN film is restricted by a holding structure near the periphery. Accordingly, on the occasion of subsequently depositing the B-W film onto the TiN film, the whole of the periphery of the substrate is covered with a clamping member, which presses down some discrete spots on the periphery so as to clamp the substrate, so that the B-W film can be deposited on only the TiN film. But, the above structure wherein the clamping member clamps the substrate has posed various problems. These problems include, for example, thermal lowering at parts of the substrate in the vicinity of the clamping member, film peeling off due to non-uniformity concerning the density or flow of an introduced reactive gas, dust generation due to physical and direct contact between the substrate and the clamping member, and a lowering Of the reliability due to the mechanical complexity of the movable sections.

Then, in order to solve those problems, non-mechanical clamping devices such as a vacuum chuck or an electrostatic chuck were proposed. These clamping devices made it possible to deposit the B-W film on the whole surface of the substrate, because they do not have the direct contact sections such as the above conventional mechanical holding structure.

Further, from another point of view, the aforementioned whole surface film deposited on the substrate has such an advantage that the number of device components produced from the substrate can be increased, because the available area on the substrate could be enlarged.

Next, one example of the conventional CVD apparatus depositing the B-W film on the whole surface of the substrate will be explained concretely by referring to FIGS. 7–9 in order to discuss some problems thereof. The conventional CVD apparatus shown in FIG. 7 has been actually described in U.S. Pat. No. 5,374,594.

In the CVD apparatus, a reactor 71 is provided with a reactive gas supply plate 72 at an upper region and with a substrate holder 73 at a lower region. The substrate holder 73 holds a substrate 74 on a top surface thereof. The plane shape of the substrate holder 73 is preferably circular.

A plurality of gas outlets are formed in a bottom surface of the reactive gas supply plate 72. A reactive gas supplied by a gas supply pipe 72a is blown off through the gas outlets and introduced into the reactor 71. The bottom surface of the reactive gas supply plate 72 faces the surface of the substrate 74 placed on the substrate holder 73. The reactive gas supplied through the reactive gas supply plate 72 deposits a desirable thin film onto the surface of the substrate 74 based on a chemical reaction thereof. Unreacted gas and by-product gas remaining in the reactor 71 after the film deposition process are evacuated through an evacuation section 75.

At a center section of the substrate holder 73 a passing-through hole 76 is formed in a vertical direction. The passing-through hole 76 is connected to an evacuation section 77 used for a differential pressure chuck. This evacuation section 77 for the differential pressure chuck is different from the aforementioned evacuation section 75 for the reactor 71. Some differential pressure grooves 78 are formed on a specific area in the top surface of the substrate holder 73. The specific area is a section on which the substrate 74 is placed, and the differential pressure grooves 78 are connected to the passing-through hole 76 (by passages not shown). The differential pressure grooves 78 include some straight line grooves directed in a diameter direction and some circular grooves arranged as concentric circles. When the substrate 74 is put on the substrate holder 73 and thereafter the differential pressure grooves 78 are evacuated, differential pressure can be generated between any one of the differential pressure grooves 78 and the opposite side of the substrate 74 to clamp the substrate 74 onto the substrate holder 73. The above-mentioned structure for clamping the substrate 74 is usually referred as a differential pressure chuck or a vacuum chuck.

A quartz window 79 having a cylindrical section 79a at the center thereof is provided in a bottom wall 71a of the reactor 71. The cylindrical section 79a has an end wall 80 at a lower opening, which has a cylindrical body 81 with the inside and outside double-walls. The cylindrical body 81 is closed by a bottom wall at a lower part and is provided with a connecting body 82 at an upper part. The inside cylindrical wall of the cylindrical body 81 forms a hole section connecting to the passing-through hole 76. A lower end portion of the inside cylinder is extended to the outside through the bottom wall of the cylindrical body 81. A purge gas is supplied into a space between the inside and outside cylindrical walls of the cylindrical body 81 through a purge gas introduction section 83. In the aforementioned connecting body 82, a hole connecting to the passing-through hole 76 is formed at the center thereof and a plurality of purge gas supply passages 84 are formed at the periphery thereof.

The above-mentioned substrate holder 73 is clamped on the cylindrical body 81 by means of the connecting body 82 supporting the substrate holder 73. In accordance with such a supporting structure, the substrate holder 73 is arranged at a lower and central part of the reactor 71. Three members, that is, the substrate holder 73, the connecting body 82, and the cylindrical body 81 are united as one by welding or the like. The hole 76 or the like forming the differential pressure chuck, the purge gas supply passages and the inside space of the reactor 71 are mutually separated in accordance with the above structures.

Further, in the top surface of the substrate holder 73, a purge gas blowing channel 85 having a circular shape is formed. In addition, a plurality of purge gas passages 86 connecting each of the purge gas supply passages 84 in the connecting body 82 and the purge gas blowing channel 85 are formed within the substrate holder 73 in a diameter direction thereof. The number of purge gas supply passages 84 in the connecting body 82 or purge gas passages 86 in the substrate holder 73 is eight e.g., and the eight purge gas supply passages 84 and the eight purge gas passages 86 are arranged at equal angles in the circumferential direction with respect to the center of the substrate holder 73. The depth direction of the purge gas blowing channel 85 is perpendicular to the top surface of the substrate holder 73, and an outer wall-surface 85a of the channel 85 is located within the peripheral edge of the substrate 74 placed on the top surface of the substrate holder 73. Each of the above purge gas passages 86 has an outlet opening onto an inner wall-surface 85b of the channel 85.

A cylindrical shield member 87 clamped on the bottom wall of the reactor 71 is arranged around the substrate holder 73. The shield member 87 is approximately as high as the substrate holder 73. The shield member 87 forms spaces under and around the substrate holder 73. The spaces are used as passages for passing another purge gas introduced through another purge gas introduction section 88.

An annular lamp support member 89 with reflectors is disposed below the reactor 73. A plurality of heating lamps 90 are mounted on the lamp support member 89 at substantially equal spacing. Radiant heat generated from the heating lamps 90 is provided to the substrate holder 73 through the quartz window 79 in order to heat the substrate holder 73. The substrate 74 is heated by the heat conducted from the substrate holder 73. The temperature of the substrate holder 73 is measured by a thermocouple 91 embedded therein, and thereafter measured data is used for controlling the temperature of the substrate holder 73.

In accordance with the above-mentioned configuration, the reactive gas is introduced into the reactor 71 through the reactive gas supply plate 72 facing the substrate 74, and a desirable film is deposited onto the substrate 74 on the basis of the chemical reaction. The unreacted gas and by-product gas generated in the reactor 71 are evacuated by the evacuation section 75. While depositing the film on the substrate 74, the purge gas is supplied into the reactor 71 through the purge gas introduction section 83, the purge gas supply passages 84, the purge gas passages 86 and the purge gas blowing channel 85. The purge gas blown off from the peripheral region around the substrate 74 prevents the film deposition on the rear surface of the substrate 74. The purge gas introduced into the purge gas blowing channel 85 is blown off toward the inside of the reactor 71 through a clearance 92 between the substrate 74 and the substrate holder 73 and thereby prevents the reactive gas from entering the back space of the substrate 74. In addition, a different purge gas is supplied into the reactor 71 through the purge gas introduction section 88 and the purge gas passages which are configured by the substrate holder 73, the quartz window 79 and the shield member 87. The different purge gas blown off from the region around the substrate holder 73 prevents a film deposition on the quartz window 79 and the substrate holder 73.

On the other hand, the films having been deposited on the substrate holder 73 or the like can be removed by a RIE cleaning process at every film deposition process or every lot.

Ordinary conditions for the B-W film deposition at the first stage of generating initial formation cores in the aforementioned CVD apparatus are a 2–10 sccm flow rate for the reactive gas $WF_6$, a 2–10 sccm flow rate for $SiH_4$, a 100–500 sccm flow rate for the purge gas (Ar), 400°–500° C. for the film deposition temperature, and 0.5–10 Torr for the film deposition pressure. Then, the conditions for a thick film being deposited by reduction of $H_2$ are a 50–200 sccm flow rate for the reactive gas $WF_6$, a 500–2000 sccm flow rate for $H_2$, a 300–1000 sccm flow rate for the purge gas Ar, 400°–500° C. for the film deposition temperature, and 30–70 Torr for the film deposition pressure.

Next, another example of the conventional B-W film CVD apparatus will be explained by referring to FIG. 8. In FIG. 8, components being substantially identical to those of the CVD apparatus shown in FIG. 7 shall be designated by the same reference number and will not be explained in detail.

The conventional CVD apparatus shown in FIG. 8 also has the reactive gas supply plate 72 at an upper region and a substrate holder 93 at a lower region in the reactor 71. In the substrate holder 93, the differential pressure grooves 78 are formed on the top surface and the vertical passing-through hole 76 is formed at the center thereof. The differential pressure grooves 78 are connected with the passing-through hole 76 (by passages not shown). The quartz window 79 is fitted to the bottom wall of the reactor 71 and further a cylindrical support body 94 is clamped to the center of the quartz window 79. The aforementioned substrate holder 93 is clamped to the upper section of the cylindrical support body 94 with several screws 95. The passing-through hole 76 of the substrate holder 93 is connected to a central hole of the support body 94 so as to communicate with the evacuation section 77 for the differential pressure chuck. The lamp support member 89 with the heating lamps 90 and the reflectors are arranged below the quartz window 79. Further, the end wall 80 is provided with the purge gas introduction section 88.

The substrate 74 placed on the top surface of the substrate holder 93 is clamped by the aforementioned differential pressure chuck system.

A ring plate 96 is arranged around the top surface of the substrate holder 93 so as to cover the peripheral area of the top surface by the whole inner edge portion thereof. The ring plate 96 is supported by a plurality of vertical-direction movable support rods 97 and therefore can be moved in the vertical direction in accordance with the action of the rods. To be exact, the ring plate 96 is placed in the vicinity of the periphery of the substrate 74 clamped on the substrate holder 93. The inner edge portion of the ring plate 96 and the outer edge portion of the substrate 74 are overlapped with each other with a clearance 100 between them. Further, a cylindrical shield member 98 is disposed around the ring plate 96. The shield member 98 has a seal ring 99 on an upper rim thereof. If the ring plate 96 is moved to its lowest position, the bottom surface of the outer edge thereof contacts with the seal ring 99. When the ring plate 96 is placed at the lowest position, a passage where the purge gas introduced by the purge gas introduction section 88 flows is formed on the basis of the structure configured by the bottom wall of the reactor 71, the quartz window 79, the shield member 98, the ring plate 96, and the substrate holder 93. The purge gas introduced into the reactor 71 is blown off through the predetermined clearance 100 formed between the ring plate 96 and the substrate 74. This structure can prevent the film from being deposited on the rear surface of the substrate 74, because the purge gas blown off from the clearance 100 prevents the reactive gas supplied by the reactive gas supply plate 72 from entering the space behind the substrate 74.

The reason for causing the ring plate 96 to be movable in the vertical direction is to obtain a purge gas of a desirable blow-off rate through the clearance 100, which does not have any effect on the distribution of the film deposited on the substrate 74, by controlling the position of the ring plate 96 covering the outer periphery of the substrate 94.

An experimental result which has been obtained by the experimental apparatus shows that the film can not be deposited on the rear surface when the blow-off rate of the purge gas is included within the range of 50–700 cm/min, under the ordinary conditions mentioned below. This means that, when the clearance 100 is 0.2 mm, the flow amount of the purge gas is about 50–700 sccm on the condition of depositing the film onto a substrate of 6-inch diameter. The distribution of the film deposited on the 6-inch substrate, which is deposited within a circular range whose radius is less than the radius of the 6-inch substrate by 10 mm, is included within the range of 2–3%.

Ordinary conditions for the second conventional apparatus as to the B-W film deposition at the first stage of generating initial formation cores are a 2–10 sccm flow rate for the reactive gas $WF_6$, a 2–10 sccm flow rate for $SiH_4$, a 100–300 sccm flow rate for the purge gas (Ar), 400°–500° C. for the film deposition temperature, and 0.5–10 Torr for the film deposition pressure. Then, the conditions for a thick film being deposited by reduction of $H_2$ are a 50–200 sccm flow rate for the reactive gas $WF_6$, a 500–2000 sccm flow rate for $H_2$, a 300–7000 sccm flow rate for the purge gas Ar, 400°–500° C. for the temperature of the substrate holder, and 30–70 Torr for the film deposition pressure.

The conventional CVD apparatus explained as the first example poses the following problems. When blowing off the purge gas toward the whole outer periphery of the substrate 74 through the clearance 92, the purge gas is apt to be blown off under the state that it concentrates at spots respectively corresponding to the outlets of the purge gas passages 86 for supplying the purge gas into the circular purge gas blowing channel 85. Consequently, since the purge gas blown off from the clearance 92 can not be uniform along the circular purge gas blowing channel 85, there are some purge gas weakly-blown off regions in which film deposition on the rear surface of the substrate 74 does occur. FIG. 9 shows the state such that the films are deposited on the rear surface of the substrate 74. There are generally eight purge gas passages 86, and accordingly eight regions on which the W (tungsten) film 102 is deposited are produced. Each of these eight regions is formed between each two neighboring spots 101 which respectively correspond to the purge gas passages 86.

On the other hand, even if the flow amount of the purge gas is increased in order to sufficiently supply it to the relatively weak blow-off regions, the relationship between strong and weak blow-off of the purge gas is maintained, and the phenomenon causes the temperature of the substrate to decrease and the density of the reactive gas at the spots where the purge gas is blown off strongly is reduced. Consequently, the distribution of the film deposited on the surface of the substrate 74 is reduced.

Further, if the flow amount of the purge gas blown off through the clearance 92 is increased furthermore, the substrate 74 easily slips off the substrate holder 73, because the purge gas produces force in a direction perpendicular to the substrate 74. Especially, when the film deposition pressure is 10 Torr or less and the flow amount of the purge gas is increased, the state of the substrate placed on the substrate holder becomes unstable, because the differential pressure between the upper side of the substrate and the differential pressure channel become smaller. The state will become more unstable when introducing the gas or performing the evacuation process after the film deposition process.

In addition, the conventional structure of uniting the substrate holder and the support section which connects the substrate holder and the evacuation section for the purge gas supply section or the differential pressure chuck poses a problem as to maintenance. That is, it is difficult to clean the substrate holder or release it for exchange.

The conventional CVD apparatus explained as the second example poses the following problems. This conventional apparatus having the mechanism moving the ring plate 96 upward or downward has three problems. The first one is that the mechanism is apt to be complicated. The second one is that the mechanism is a cause of generating undesirable particles or dust. The third one is that the throughput is reduced due to the time used for the upward or downward motion of the ring plate.

The problem as to the complexity of the mechanism is due to the necessary structure for the upward and downward moving mechanism and a driving mechanism. Further, the complexity problem is increased by the need for the structure for forming the purge gas passages, and the structure for maintaining airtightness between the purge gas passages and the inside of the reactor. The complexity of the mechanism causes lowering of maintenance and operating efficiency.

The problem of particle generation is due to the mechanical movable sections. The motions of these sections cause the generation of particles in the reactor and the reduction of a yield rate in manufacturing semiconductor devices. Especially, particles are easily generated when depositing films on the ends of the ring plate 96.

The reason for the problem of reduction in throughput is as follows.

The throughput is totally determined by the amount of time required for depositing the B-W film on the substrate and for carrying the substrate in the reactor. The amount of time for depositing the B-W film is normally about 4–5 minutes. On the other hand, in the second conventional CVD apparatus, the substrate must be kept at a standstill during the upward and downward motion of the ring plate 96. Thus, since the amount of time for carrying the substrate is increased, the throughput is reduced.

SUMMARY OF THE INVENTION

The first object of the present invention is to provide a CVD apparatus by which an excellent and uniform film can be deposited onto the whole surface of a substrate because blow-off non-uniformity for purge gas blown off from the outer periphery of the substrate is substantially eliminated and therefore generation of film deposition onto a rear surface thereof is prevented, and which can provide high productivity and high yield.

The second object of the present invention is to provide a CVD apparatus which has simple structure and increases productivity, and in which film deposition at a low pressure condition can be preferably performed.

The above objects are attained by a CVD apparatus of the first present invention which is equipped with a reactor, a substrate holder for holding a substrate on a top surface thereof, which is disposed in the reactor, an evacuation unit for evacuating the reactor, a reactive gas supply mechanism for supplying a reactive gas into the reactor, a heating mechanism for heating the substrate holder, a clamping mechanism such as a differential pressure chuck clamping section for clamping the substrate placed on the substrate holder without pressing the surface thereof to be processed, and a purge gas supply mechanism for supplying purge gas (first purge gas). In the CVD apparatus, the substrate holder is configured to have a circular purge gas blowing channel on the top surface thereof, in which a diameter of an outside wall-surface is less than a diameter of the substrate, and a plurality of purge gas passages (first purge gas passage) in an inside thereof, which supply the first purge gas introduced by the purge gas supply mechanism into the purge gas blowing channel. A novel subject of the CVD apparatus of the present invention is particularly that the purge gas flows in the purge gas blowing channel and is blown off from a clearance between the outside periphery of the substrate and the substrate holder into the reactor, and further, each of the purge gas passages includes a radius-directed part directed in a radius direction of the substrate holder and has a purge gas outlet provided on the outside wall-surface of the purge gas blowing channel.

In accordance with the above configuration, a blow-off direction of the purge gas blown off from each of the purge gas outlets is opposite to a blow-off direction of the purge gas blown off from the clearance between the substrate and the substrate holder at a spot corresponding to each of the gas outlets. Accordingly, the flow of the purge gas in a circumferential direction within the purge gas blowing channel is turbulent and dispersed, and therefore the purge gas blow-off pressure in the whole periphery of the substrate is made uniform.

In accordance with the feature of the CVD apparatus, the novel subject of the first present invention can be grasped as a plurality of purge gas passages, each of which is formed so that a blow-off direction of the purge gas blown off from a gas outlet thereof is opposite to a blow-off direction of the purge gas blown off from the clearance between the substrate and the substrate holder at a spot corresponding to the gas outlets.

A CVD apparatus of the second present invention, which has the above-mentioned basic configuration, further comprises a shield member having a ring-plate part covering an outer periphery of the top surface and a cylindrical part covering the side portion of the substrate holder, whereby a purge gas supply passage (second purge gas passage) for supplying a different purge gas (second purge gas) is formed around the substrate holder, and the second purge gas is blown off from a clearance between the ring-plate part and the substrate holder. Thus, the CVD apparatus has the first and second purge gas passages respectively for supplying the first and second purge gases.

In accordance with the configuration of the second present invention, on the basis of the suitable combination of the first and second gases with respect to the blow-off amount, the clamping of the substrate on the substrate holder can be stabilized under a low pressure condition, the film deposition onto the rear surface of the substrate can be prevented.

In the above configurations of the first and second present inventions, preferably, the purge gas blowing channel is formed so that a depth direction thereof is perpendicular to the top surface, and each of the first purge gas passages includes an axis-directed part directed in an axis direction of the substrate holder together with the radius-directed part, and further the radius-directed part of the first purge gas passage is turned back so as to be connected to the purge gas blowing channel.

In the above configurations of the first and second present inventions, preferably, an end of the radius-directed part of the first purge gas passage, which is connected to the purge gas blowing channel, is substantially perpendicular to the outside wall-surface thereof.

In the above configurations of the first and second present inventions, preferably, the purge gas outlet of the first purge gas passage is disposed near a bottom section of the purge gas blowing channel.

In the above configurations of the first and second inventions, preferably, the top surface of the substrate holder has a step between the inside area and the outside area of the purge gas blowing channel.

In the above configurations of the first and second inventions, preferably, a height of the step is determined so that a blow-off rate of the purge gas blown off from the clearance between the substrate and the substrate holder, which is formed by the step, is included in a range of 50–700 cm/min.

In the above configurations of the first and second inventions, preferably, on the top surface of the substrate holder the inside area of the purge gas blowing channel is as high as the outside area thereof, and a fine uneven area is formed around the purge gas blowing channel and within a range on the inside of a peripheral edge of the substrate.

In the above configurations of the first and second inventions, further preferably, a ring member placed in the side of an inside wall-surface is disposed in the purge gas blowing channel.

In the above configuration of the second inventions, a predetermined clearance is formed between the ring-plate part and the substrate or the substrate holder. In this case, it is desirable that an inner diameter of the ring-plate part is greater than a diameter of the substrate. In addition, it is desirable that a distance of the clearance between the ring-plate part and the substrate holder is determined so that a blow-off rate of the purge gas blown off from the clearance is included in a range of 50–700 cm/min.

DESCRIPTION OF THE PREFERRED EMBODIMENTS

In accordance with the accompanying drawings, some preferred embodiments of the present invention will be explained hereinafter.

Figure 2:
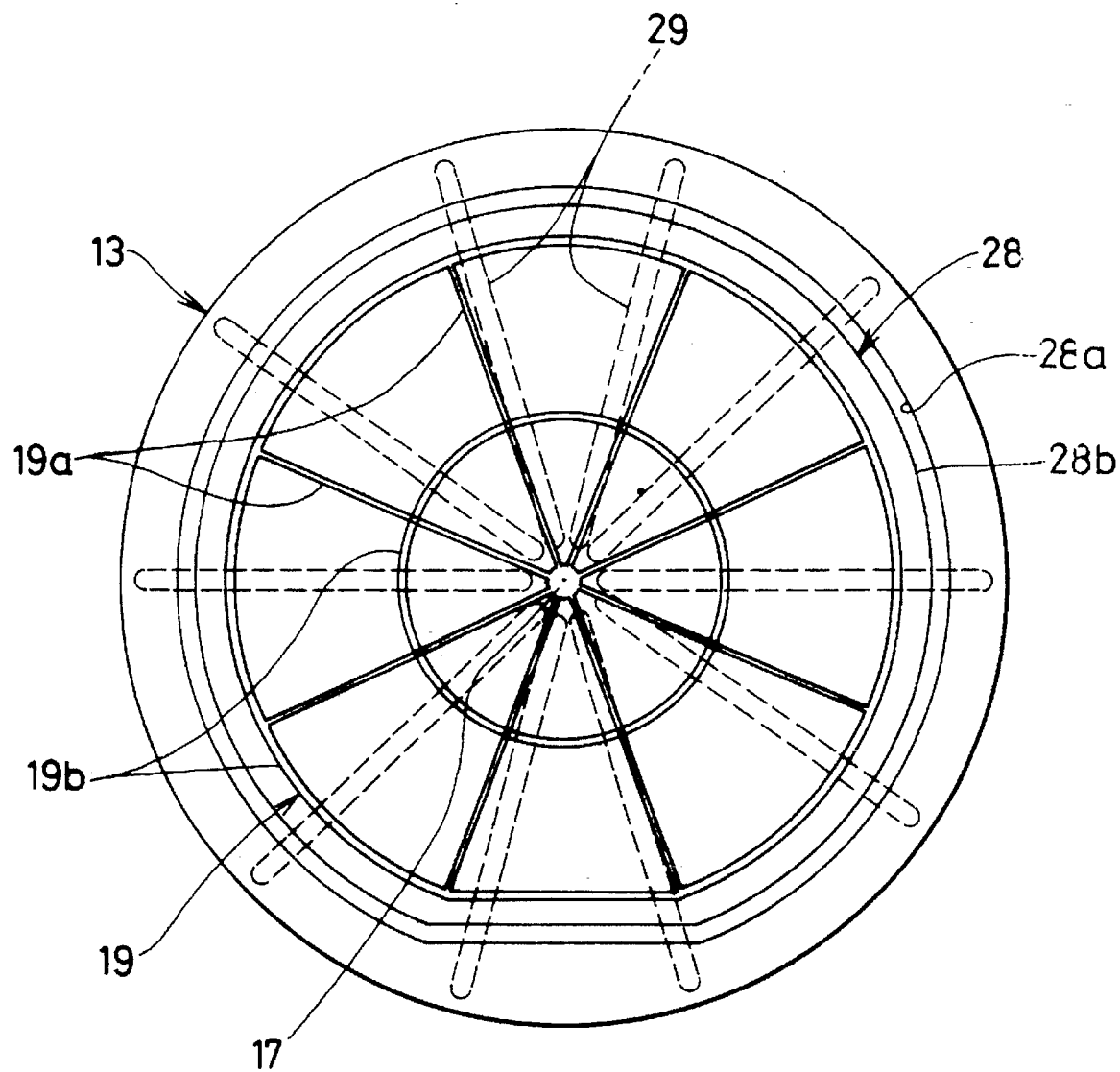
FIG. 2 is a plan view of a substrate holder for the CVD apparatus of the first embodiment.
Figure 3:
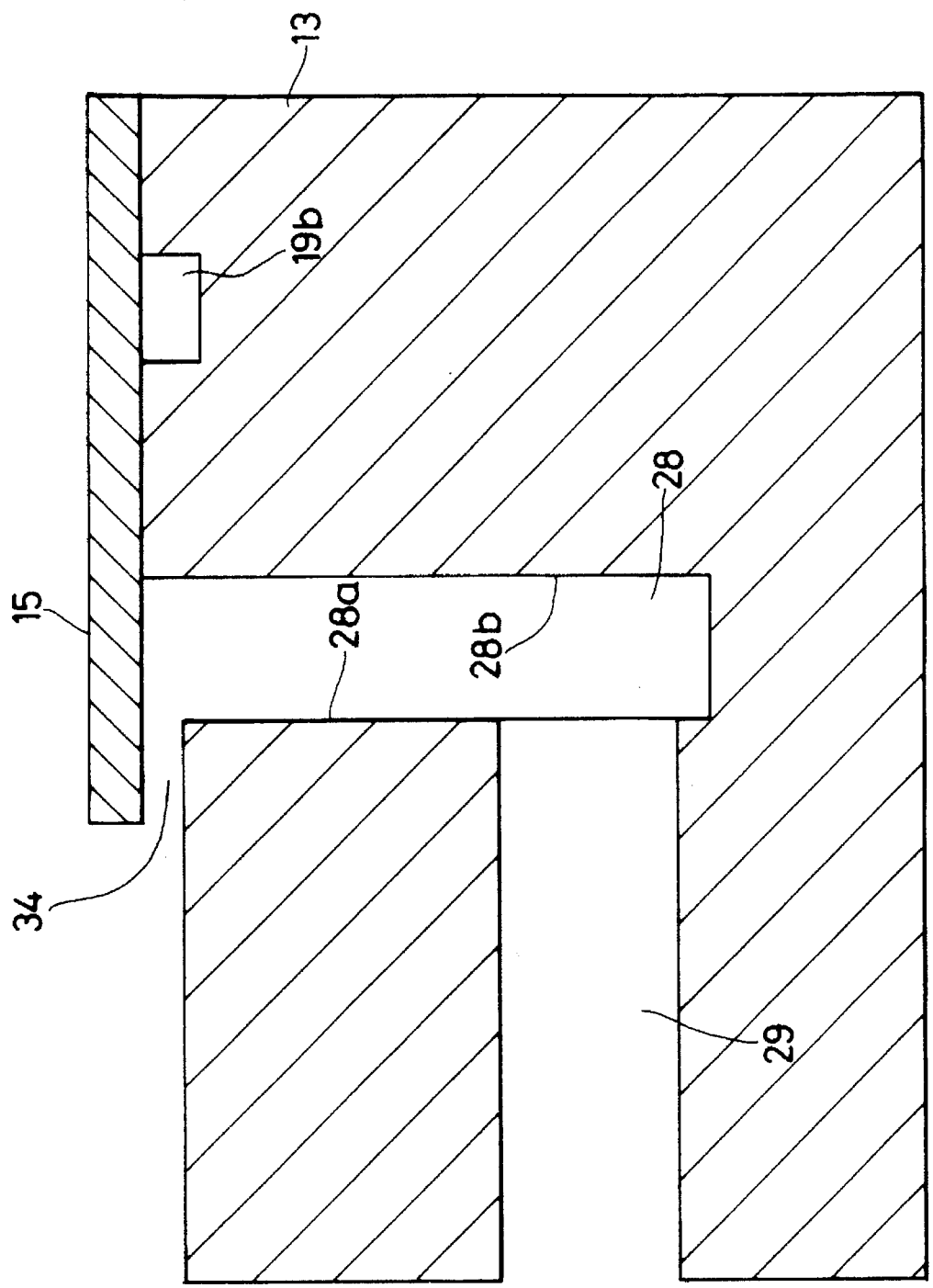
FIG. 3 is a fragmentary enlarged vertical sectional view of the substrate holder for the CVD apparatus of the first embodiment.

At the start, a first embodiment of a CVD apparatus in accordance with the present invention will be explained by referring to FIGS. 1–3. This first embodiment illustrates the CVD apparatus for depositing the (for brevity hereinafter referred to as a film) B-W film onto substrates.

Figure 1:
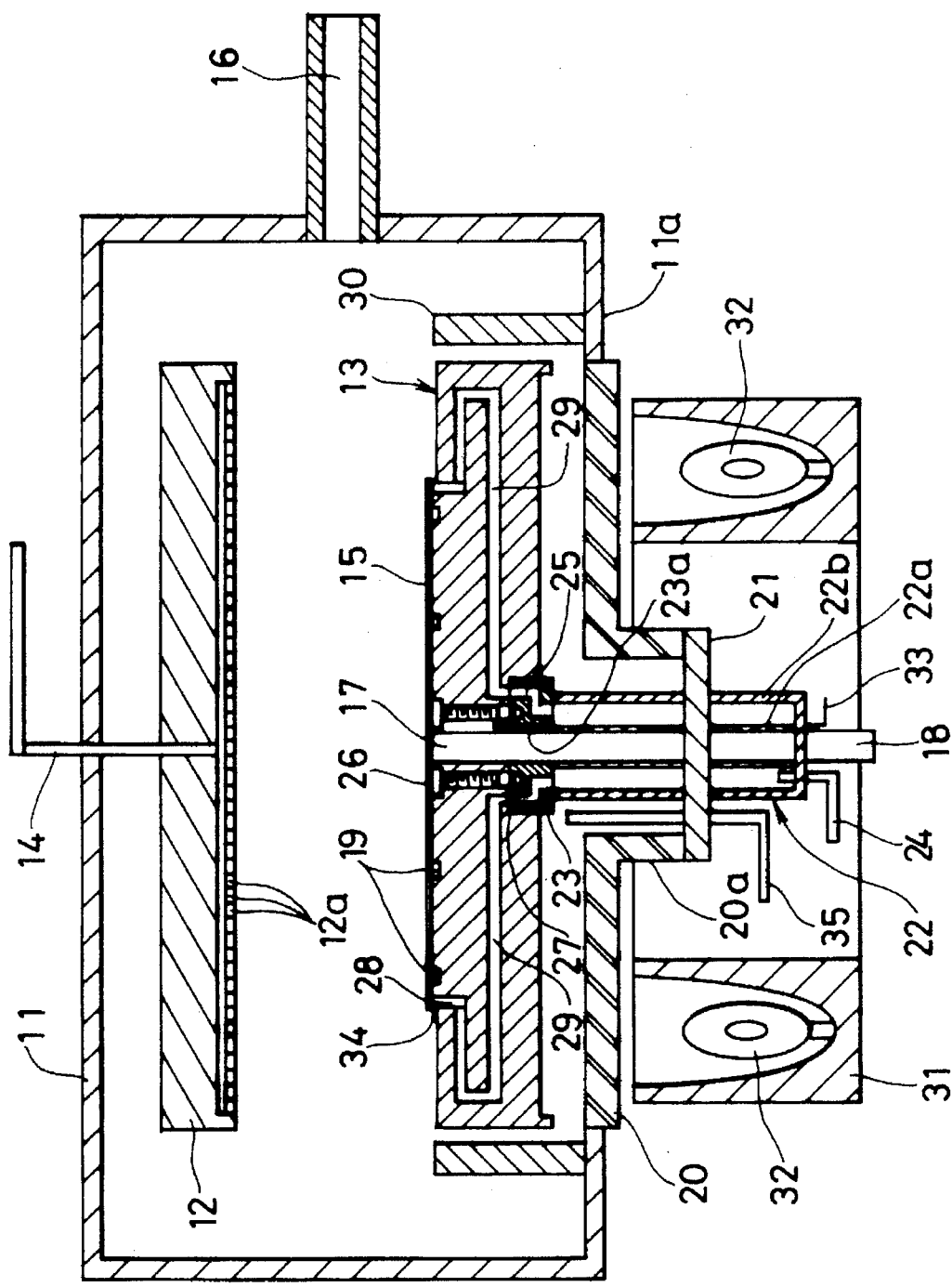
FIG. 1 is a longitudinal sectional view schematically showing a CVD apparatus of a first embodiment.

In a CVD apparatus shown in FIG. 1, there are a reactive gas supply plate 12 at an upper side in a reactor 11 and a substrate holder 13 at a lower side thereof. The body of the substrate holder 13 is made of aluminum material e.g. and a substrate 15 to be processed by CVD reaction is placed on the top surface of the substrate holder 13. A plane shape of the substrate holder 13 is circular.

There are a plurality of gas outlets 12a in the bottom surface of the reactive gas supply plate 12, through which a reactive gas supplied by a gas supply pipe 14 is injected into the inside space of the reactor 11. The bottom surface of the reactive gas supply plate 12 faces the surface of the substrate 15 placed on the top surface of the substrate holder 13. The reactive gas supplied by the reactive gas supply plate 12 deposits a desirable film onto the surface of the substrate 15. Unreacted gas and by-product gas generated in the reactor 11 can be evacuated by an evacuation section 16.

At the center of substrate holder 13, a hole 17 passing through the center at a vertical direction is formed. The passing-through hole 17 is connected to a differential pressure chuck evacuation section 18 being disposed at a lower portion thereof. This evacuation section 18 for the differential pressure chuck is different from the above-mentioned evacuation section 16 provided for the reactor 11. In the top surface of the substrate holder 13, differential pressure grooves 19 are formed at an area coming into contact with the substrate 15. These differential pressure grooves are connected with the passing-through hole 17 by passages not shown in FIG. 1. The differential pressure grooves 19, as shown in FIG. 2, for example, include eight straight grooves 19a which are radially arranged in a radius direction and two round grooves 19b arranged concentrically with respect to the substrate holder 13. Each of the differential pressure grooves 19 has a depth of 1 mm e.g. and a width of 1.5 mm e.g. As to the round grooves 19b, the diameter of the inside one is 71 mm and the diameter of the outside one is 133 mm, for example. When evacuating the inside spaces of the differential grooves 19 by the evacuation section 18 for the differential pressure chuck under the condition that the substrate 15 is placed on the top surface of the substrate holder 13, a differential pressure between each of the differential grooves and the opposite side of the substrate 15 is produced. This structure for clamping the substrate makes it possible to deposit a film on whole surface of the substrate 15, because there are not any mechanical portions directly coming into contact with the surface to be deposited in the substrate 15. Normally, the clamping structure is referred to as a differential pressure chuck or a vacuum chuck. In addition, an electrostatic chuck device can be used as a different clamping device.

In accordance with the structure of the above-mentioned differential pressure grooves 19, the substrate 15 can be clamped to the substrate holder 13. In the CVD apparatus of the present embodiment, since there are no mechanical portions directly contacting with the upper surface of the substrate 15, temperature (heat) distribution in the surface of the substrate 15 will be determined only by a contact state of the substrate 15 and the substrate holder 13. Therefore, if the temperature distribution of the substrate holder 13 is uniform and if the substrate 15 is clamped to the substrate holder 13 with uniform contact, the substrate 15 will also have a uniform temperature distribution.

In FIG. 1, a lower wall 11a of the reactor 11 is equipped with a quartz window 20 having a cylindrical section 20a at its center section. A lower opening of the cylindrical section 20a has an end wall 21 to which an internal and external double cylindrical body 22 is clamped. This cylindrical body 22 supports the substrate holder 13. The lower opening of the cylindrical body 22 is closed and the upper portion is connected with a connecting body 23. An internal cylinder 22a of the cylindrical body 22 has a hole connected to the above-mentioned hole 17 and its lower portion is extended to the outside through the end wall of the cylindrical body 22. A space between the internal and external cylinders 22a and 22b of the cylindrical body 22 is supplied with a purge gas (a first purge gas) through a purge gas introduction section 24. In the connecting body 23, at a center portion thereof, there is a hole 23a connecting to both of the above-mentioned passing-through hole 17 and the inside hole formed by the internal cylinder 22a, and further ten purge gas supply passages 25 are formed around the hole 23a.

The substrate holder 13 is clamped to the connecting body 23 with screws 26 so that it is supported by the cylindrical body 22. Thereby, the substrate holder 13 supported by the cylindrical body 22 is preferably arranged horizontally at a lower and center position of the reactor 11. The substrate holder 13, the connecting body 23 and the cylindrical body 22 are united to be one body. This structure causes any two of the passing-through hole 17 or other holes used for the differential pressure chuck, the purge gas supply passages 25, and the inside space of the reactor 11 to be separated. In addition, a seal member 27 is provided between the connecting body 23 and the substrate holder 13, which prevents leakage of the purge gas to outside of the passages.

In the substrate holder 13, a purge gas blowing channel 28 with a round shape is formed on the top surface thereof, and further, for example, ten purge gas passages 29 are also formed in the internal parts thereof. Each of the ten purge gas passages 29 connects the corresponding purge gas supply passage 25 and the purge gas blowing channel 28 formed on the substrate holder 13. Each of the purge gas passages 29 supplies the purge gas blowing channel 28 with the first purge gas introduced through the purge gas introduction section 24. Each of the purge gas passages 29 comprises a preferably horizontal radius direction part directed in the radius direction of the substrate holder 13 and a preferably vertical axis direction part parallel to the axis thereof. As shown in FIG. 2, the ten radius direction parts for the ten purge gas passages 29 are arranged in a radial pattern at equal angle intervals. Further, as shown in FIG. 1, the radius direction part of the purge gas passages 29 comprises a first radius direction part that is located at the lower side and is substantially longer than the outside radius of the purge gas blowing channel 28 or the radius of the round outside wall-surface 28a (shown in FIGS. 2 and 3), and a second radius direction part that is located at the upper side and has its outlet on the outside wall-surface 28a of the purge gas blowing channel 28. Thus, as a whole, the purge gas passage 29 is extended so as to become longer than the radius of the purge gas blowing channel 28, and the outside end portion thereof, which exists in the outside of the circular channel 28, is folded back toward the center of the substrate holder 13 by way of the vertical axis direction part, so that the outlet thereof opens on the outside wall-surface 28a of the purge gas blowing channel 28. In the substrate holder 13, the purge gas passages 29 are actually manufactured so that the first and second radius direction parts and the axis direction part are individually formed by means of forming holes thereto and connecting them mutually. The openings of the holes are closed by means of plugs after manufacturing the first and second radius direction parts and the axis direction parts by utilizing the holes.

Further, in the top surface of the substrate holder 13, there is a step between the inside surface within the circular purge gas blowing channel 28, that is, the surface on which the substrate is placed, and the outside surface around the channel 28. The step has a height of 0.2 mm e.g. and allows a clearance 34 to be formed for blowing off the purge gas between the substrate holder 13 and the substrate 15 placed on the inside surface.

The number of purge gas supply passages 25 formed within the connecting body 23 is the same as the number of the purge gas passages 29 in the substrate holder 13 and they are similarly arranged in a radial pattern at equal angle intervals. As shown in FIG. 3, the above-mentioned purge gas blowing channel 28 is formed so that the depth direction thereof is preferably perpendicular to the top surface, that is, the inside surface on which the substrate is placed, of the substrate holder 13, and the outside wall-surface 28a thereof is positioned on the inside of the circular peripheral end of the substrate 15 placed on the substrate holder 13. Namely, it is so designed that the radius of the outside wall-surface 28a of the purge gas blowing channel 28 is less than that of the substrate 15. The example concerning the actual measurements of the purge gas blowing channel 28 is such that its inside diameter (the diameter of an inside wall-surface 28b) is 140 mm, its depth is 10 mm, and its width is 2.5 mm, for example. The exit of the purge gas passage 29 or the purge gas outlet is connected to the purge gas blowing channel 28 so as to open preferably on the outside wall-surface 28a close to the bottom portion thereof.

A cylindrical shield member 30 fastened to the bottom wall 11a of the reactor 11 is arranged around the side of the substrate holder 13. The shield member 30 and the substrate holder 13 are approximately the same height. It allows a necessary space to be formed under the substrate holder 13 and around the side thereof to arrange the shield member 30 in the reactor 11. This space is used as a passage for allowing another purge gas (a second purge gas) to flow, which is introduced through another purge gas introduction section 35 provided separately.

An annular lamp support member 31 having reflectors is disposed below the reactor 11. The lamp support member 31 is provided with a plurality of heating lamps 32 are transmitted at equal intervals. Heat (rays) radiated from the lamps 32 is given to the substrate holder 13 through the quartz window 20 to heat it. Further, the substrate 15 is heated by the heated substrate holder 13. The temperature of the substrate holder 13 is measured by a thermocouple 33 embedded therein and the data obtained thereby is used for controlling the temperature of the substrate holder 13 by means of a heat control system which is not shown.

In accordance with the aforementioned configuration, the difference pressure chuck causes the substrate 15 to be clamped on the substrate holder 13 kept to be a predetermined temperature by the heat lamps 32. The reactive gas is introduced into the reactor 11 through the reactive gas supply plate 12 facing the substrate 15 so as to deposit a desirable film onto the surface of the substrate 15. Unreacted gas and by-product gas produced in the reactor 11 are evacuated through the evacuation section 16.

In the CVD apparatus of the above-mentioned example, the ordinary conditions in the first stage of generating initial formation cores for the film deposition are: a 2–10 sccm flow rate for the reactive gas $WF_6$; a 2–10 sccm flow rate for $SiH_4$; a 50–150 sccm flow rate for the first purge gas (Ar); a 150–300 sccm flow rate for the second purge gas (Ar); 400°–500° C. for film deposition temperature; and 0.5–5 Torr for film deposition pressure. The conditions in the second stage of depositing a comparatively thick film based on reduction of $H_2$ are: a 50–200 sccm flow rate for the reactive gas $WF_6$; a 500–2000 sccm flow rate for $H_2$; a 300–700 sccm flow rate for the first purge gas (Ar); a 100–300 sccm flow rate for the second purge gas (Ar); 400°–500° C. for film deposition temperature; and 30–70 Torr for film deposition temperature; 30–70 Torr for deposition pressure.

Next, a configuration of the purge gas supply passages as for the first purge gas in the aforementioned embodiment, which is a main section for preventing film deposition on the rear surface of the substrate 15, and the conditions for manufacturing the configuration, will be explained in detail.

The first purge gas is introduced through the purge gas introduction section 24, and flows between the inside and outside walls 22a and 22b of the cylindrical body 22, and is finally dispersed to each of the ten purge gas supply passages 25 in the connecting body 23. The purge gas dispersed into each purge gas supply passage 25 is supplied into the circular purge gas blowing channel 28 through the corresponding purge gas passage 29 formed within the substrate holder 13 and thereafter is dispersed in the circumferential direction of the purge gas blowing channel 28 to blow off into the reactor 11 through the clearance 34 between the substrate 15 and the substrate holder 13. The purge gas blown off toward the outside in the radius direction from the region under the peripheral edge of the substrate 15 prevents the reactive gas from entering the back space of the substrate 15. Thus, film deposition onto the rear surface of the substrate 15 can be prevented.

In the present embodiment, as explained above, since the upper end portion of the purge gas passage 29 is perpendicular to the outside wall-surface 28a of the purge gas blowing channel 28 and is connected to the lower part thereof, the flow of the purge gas in the purge gas blowing channel 28 becomes turbulent and consequently the flow of the purge gas along the circumferential direction in the purge gas blowing channel 28 is uniformly dispersed. Accordingly, the emitting pressure of the purge gas around the whole periphery of the substrate 15 can be equalized. Further, the above uniform dispersion of the purge gas prevents the reactive gas from entering to the back side of the substrate 15 in the whole peripheral edge thereof, and prevents the film from depositing on the rear surface thereof along the whole edge.

The sharper an angle between the purge gas passage 29 connected to the outside wall-surface 28a of the channel 28 and the outside wall, the greater the above described dispersion characteristic is.

The conditions for actually realizing the above-mentioned structure with respect to the purge gas are as follows. A primary factor capable of preventing the reactive gas from entering to the back side of the substrate 15 is the blow-off rate of the purge gas. The blow-off rate of the purge gas is defined as a quotient obtained by dividing the amount of purge gas flowing at the clearance 34 by an area calculated as the product of clearance distance and circumferential length thereof. In other words, the blow-off rate of the purge gas means a standard linear velocity. In this embodiment, if the circumferential length of the blow-off clearance for the purge gas is approximately equal to that of the substrate 15 (6-inch substrate e.g.), the blow-off rate of purge gas comes to be obtained by dividing the amount of the purge gas by 0.95 cm$^2$ which is calculated as the product of 15$\pi$ and 0.2 cm.

Experiments which have been executed make it clear that the prevention of depositing a film on the rear surface of the substrate and the side of the substrate holder is possible if the blow-off rate is equal to 50 cm/min or more when the deposition pressure is equal to 10 Torr or less, and if the blow-off rate is equal to 300 cm/min or more when the deposition pressure is equal to 10 Torr or more.

The above-mentioned embodiment makes it possible that the film deposition is performed without making the differential pressure chuck unstable and film deposition onto the rear surface of the substrate is sufficiently prevented on the condition that the flow rate of the purge gas is in the range of 50–150 sccm when the deposition pressure is 10 Torr or less and is in the range of 300–700 sccm when the deposition pressure is 10 Torr or more. Further, in the above conditions, the blow-off rate of the purge gas emitted from the clearance between the substrate 15 and the substrate holder 13, and that of the different purge gas emitted from the clearance between the substrate holder 13 and the shield member 30 comes to be 50–700 cm/min.

On the other hand, when the blow-off rate of the purge gas is equal to 700 cm/min or more, the film distribution on the surface of the substrate 15 is deteriorated, because the temperature of the outer periphery of the substrate 15 is lowered and the amount of the reactive gas supplied to the outer periphery of the substrate 15 is decreased.

As mentioned above, the first purge gas can be uniformly blown off from the clearance 34 formed along the round peripheral edge of the substrate 15 and can sufficiently prevent the film from being deposited onto the rear surface thereof on the basis of the configuration comprising the purge gas passage 29, the purge gas blowing channel 28 and the clearance 34. Namely, since the blow-off pressure of the purge gas along the peripheral edge of the substrate can be uniform, the generation of backside deposition can be entirely prevented. As result, a film having a satisfactory distribution can be deposited on the whole surface of the substrate, which is a region from the center to the outer periphery in the substrate, and therefore film deposition with high productivity and yield rate can be attained.

Further, film can be prevented from being deposited onto the quartz window 20 by the second purge gas (Ar) introduced through the purge gas introduction section 35 which blows off through the above clearance between the shield member 30 and the substrate holder 13.

Next, a variation of the above-mentioned first embodiment will be explained.

Figure 4:
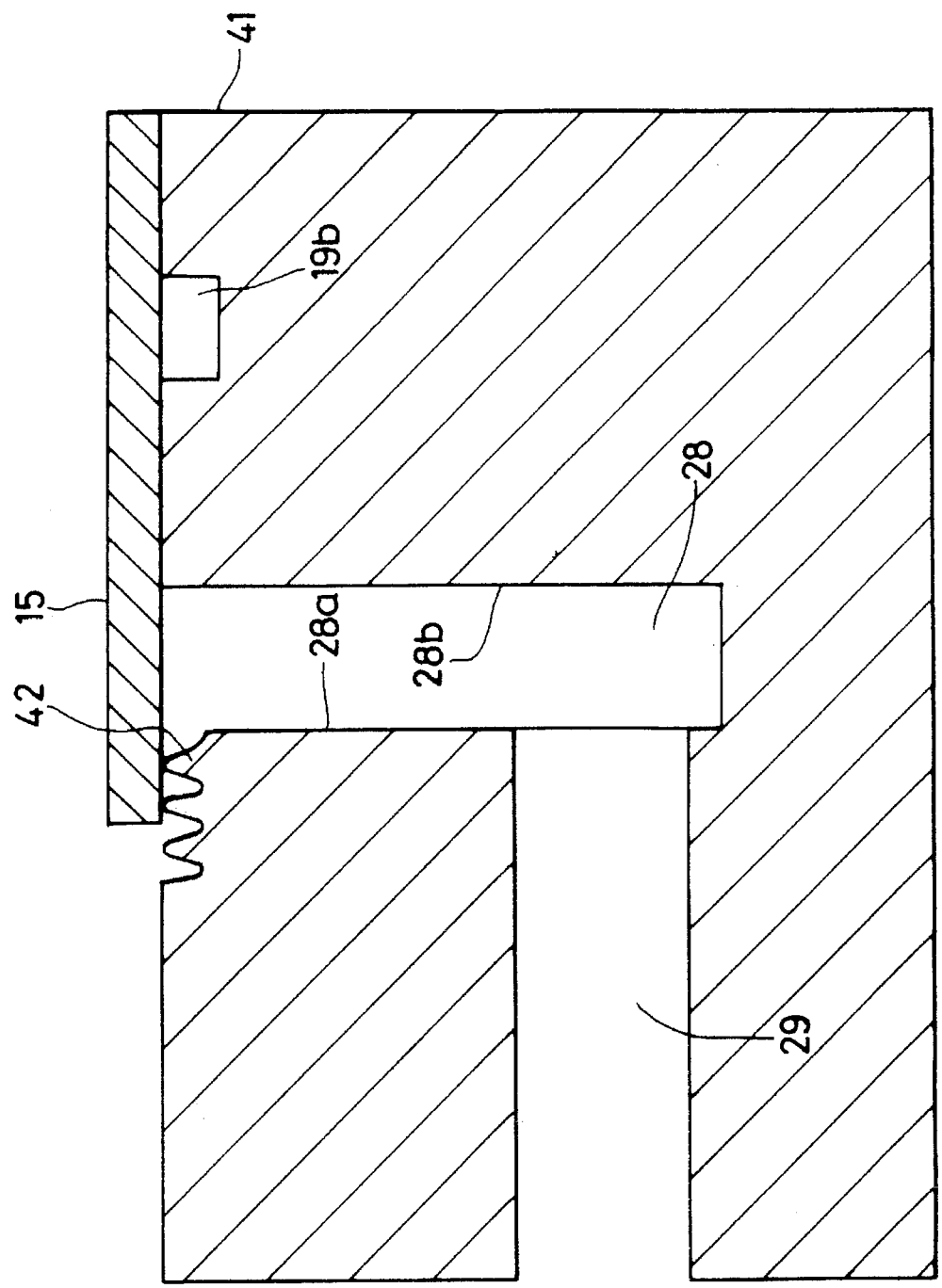
FIG. 4 is a fragmentary enlarged vertical sectional view showing one variation of the substrate holder.

FIG. 4 shows an example of the variation having a configuration such that a fine uneven surface 42 is provided in a predetermined outside area around the purge gas blowing channel 28 on the upper surface of the substrate holder 41. In this substrate holder 41, the two surfaces on the inside and outside of the purge gas blowing channel 28 preferably have substantially the same height, and the fine uneven surface is formed on the predetermined region of the surface on the outside of the purge gas blowing channel 28. The region provided with the fine uneven surface 42 is formed between the outside wall-surface 28a and the peripheral edge of the substrate 15, and may be extended a little beyond the peripheral edge. The fine uneven surface is produced by a blasting method and the difference in level between the heights and depths in the fine uneven surface (shown greatly exaggerated in FIG. 4) is on the order of dozens of microns for example. This fine uneven region provides the surface on the outside of the purge gas blowing channel 28 with fine and complicated flow passages for the purge gas, and thus the purge gas can be uniformly blown off through the clearance between the substrate 15 and the substrate holder 41 along the whole periphery of the substrate.

Figure 5:
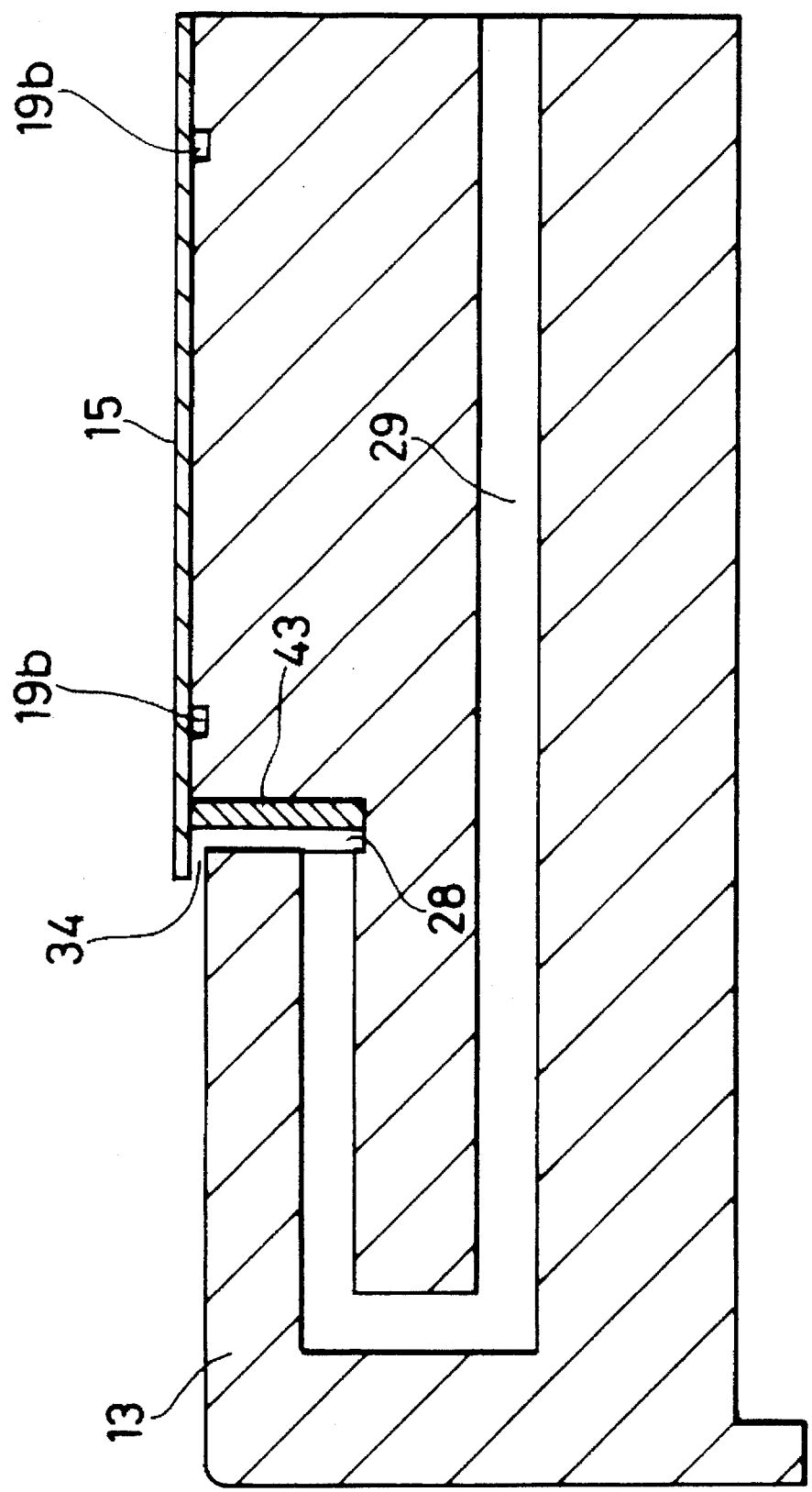
FIG. 5 is a fragmentary enlarged vertical sectional view showing another variation of the substrate holder.

FIG. 5 shows another example wherein a ring member 43 is disposed in the purge gas blowing channel 28 so as to make contact with the inside wall-surface 28b thereof. The ring member 43 is made of aluminum which is also used as material for the substrate holder 23. The disposition of the ring member 43 into the purge gas blowing channel 28 can solve the problem of the difficulty of processing the channel 28, that is, the problem of the impossibility of making the channel by means of cutting tools. Thus, the structure of disposing the ring member 43 into the purge gas blowing channel 28 so as to make contact with its inside wall-surface 28b can make the width of the channel narrow, and therefore the dispersion of the purge gas directed in the circumferential direction can be promoted. In addition, the technical effect due to the ring member 43 disposed in the purge gas blowing channel 28 is similarly attained by making the clearance 34, as an output opening for the purge gas, very small. In this case, however, the state of the substrate clamped by means of the difference pressure chuck becomes unstable, because the pressure of the purge gas in the purge gas blowing channel 28 is increased.

In the film deposition onto the substrate in accordance with the aforementioned embodiment and variations, the thickness of the film deposited on the substrate, in which the diameter of the film-deposited region to be measured is 140 mm, was at a desirable value as ±5%, and there were no films on the rear surface of the substrate. In addition, the region where the film can be deposited onto the substrate was actually limited to the inside region of the underlying TiN.

Figure 6:
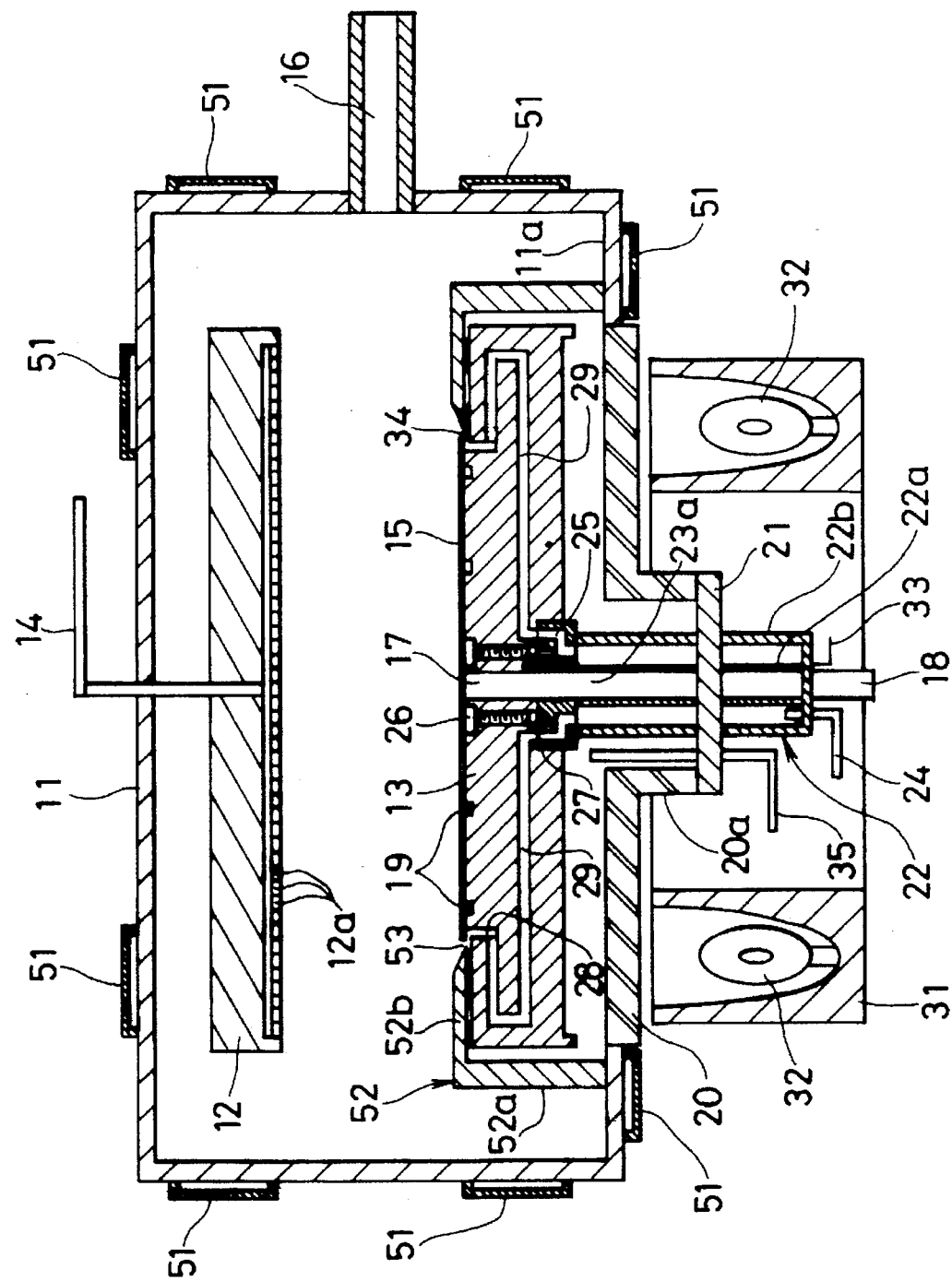
FIG. 6 is a longitudinal sectional view schematically showing a CVD apparatus of a second embodiment.
Figure 7:
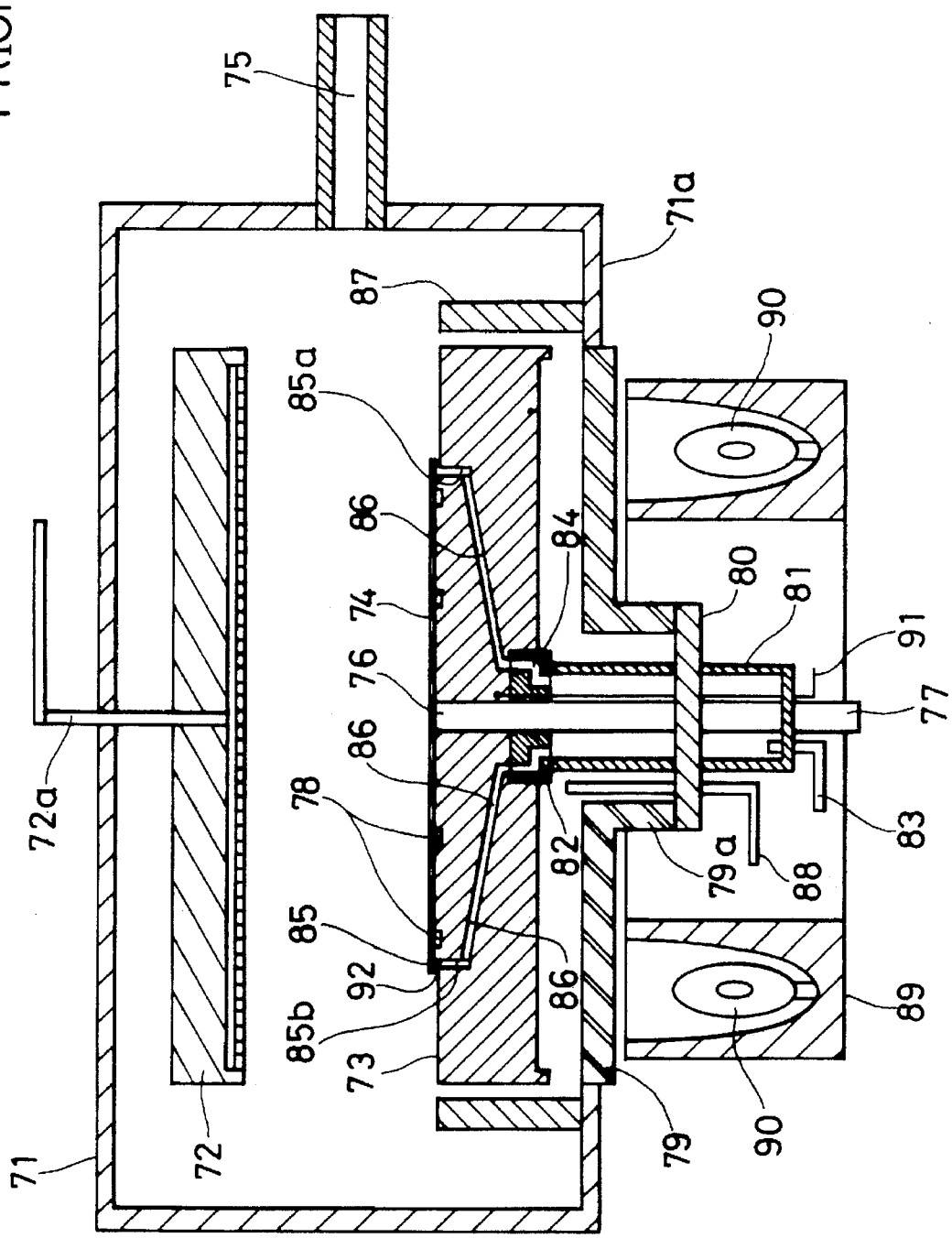
FIG. 7 is a longitudinal sectional view schematically showing a first conventional CVD apparatus.
Figure 8:
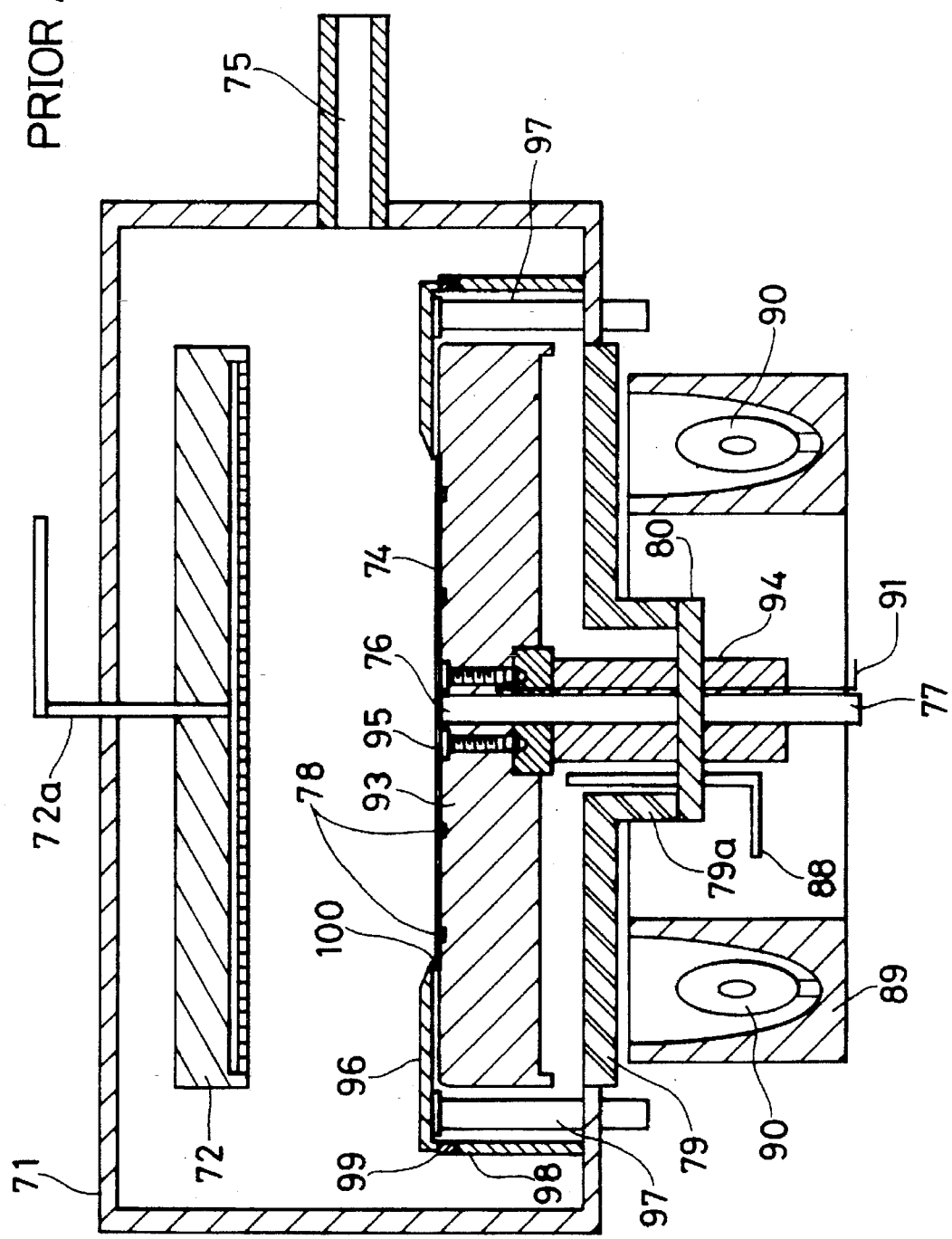
FIG. 8 is a longitudinal sectional view schematically showing a second conventional CVD apparatus.
Figure 9:
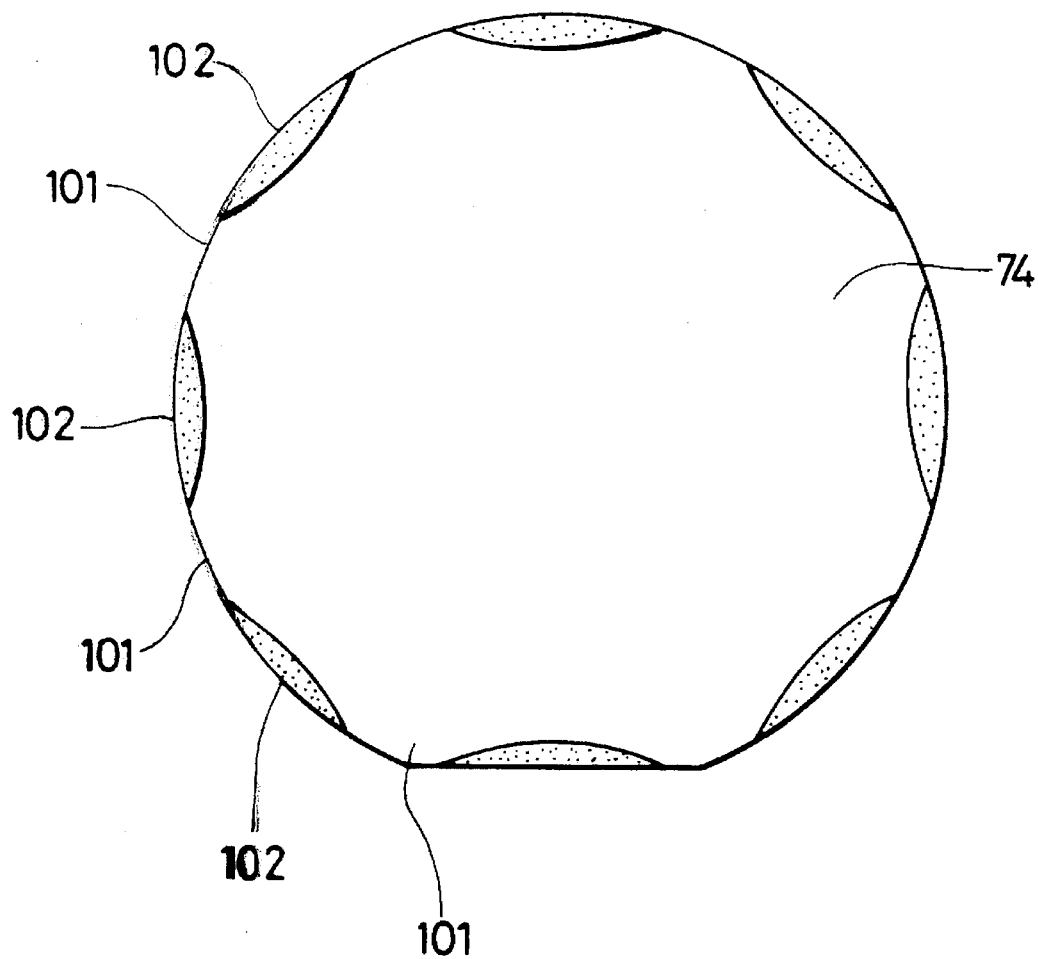
FIG. 9 is a rear elevation showing films deposited onto the rear surface of the substrate by the film deposition in the first conventional CVD apparatus.

Next, a second embodiment of the CVD apparatus of the present invention will be explained by referring to FIG. 6. In FIG. 6, components substantially identical to those described for FIG. 1 are designated by the same reference numerals, and a detailed description about them will be omitted.

A plurality of water-cooled passages 51 are provided on the outside of the reactor 11 in order to cool it. Further, a shield member 52 is disposed around the substrate holder 13. This shield member 52 has a cylindrical part 52a located around the side portion of the substrate holder 13 and a ring-plate part 52b covering the whole outer periphery of the substrate 15 placed on the substrate holder 13. The cylindrical part 52a is clamped on the bottom wall 11a of the reactor 11. A clearance between the ring-plate part 52b and the substrate holder 13 is formed to be about 1 mm at room temperature. However, the clearance is deformed to be about 0.2 mm at the film depositing temperature, because the substrate holder 13 is expanded by heat, and it becomes approximately identical to the clearance 34 between the substrate 15 and the substrate holder 13. Accordingly, the height of the inner edge of the ring-plate part 52b is almost the same as the height of the peripheral edge of the substrate 15, and a clearance 53 of about 1 mm e.g. is formed between them. Thus, a supply passage for the second purge gas introduced through the purge gas introduction section 35 is formed on the basis of both the shield member 52 and the substrate holder 13.

Other configurations shown in FIG. 6 are almost the same as those of the CVD apparatus of the first embodiment explained by referring to FIG. 1.

The second purge gas is mainly used for preventing film deposition onto the substrate holder 13. This second purge gas is blown off through the clearance between the ring-plate part 52b and the substrate holder 13 and the clearance 53 between the inner edge of the ring-plate part 52b and the peripheral edge of the substrate 15.

The second purge gas joins the first purge gas supplied through the purge gas supply passage 29 within the substrate holder 13 and the purge gas blowing channel 28 in the vicinity of the clearance 53 and thereafter is emitted into the inside of the reactor 11. In this case, the second purge gas blows toward the direction perpendicular to a plane parallel with the top surface of the substrate 15 or the substrate 15 itself on the basis of the position of the clearance 53, the blow-off direction of each of the first and second purge gases, and the joining action of the two purge gases. The blowing action of the second purge gas can prevent the reactive gas from entering the space between the substrate 15 and the ring-plate part 52b. To describe it more exactly, the reactive gas approaching the clearance 53 from an upper region is diluted by the joined purge gases, and the reactive gas is prevented from entering to the rear space of the substrate 15 is prevented by the first purge gas ejected from the clearance 34, and the reactive gas is prevented from entering to the space between the substrate holder 13 and the ring-plate part 52b by the second purge gas.

The configuration according to the above second embodiment can naturally produce the same action and technical effect as the first embodiment.

In comparison with the above-mentioned second conventional apparatus, the second embodiment has the following advantages, because the shield member 52 is clamped. The shield member 52 is clamped on the lower wall 11a of the reactor 11 with screws or the like, and therefore does not require a special up and down movable mechanism. Accordingly, the time necessary for maintaining the CVD apparatus of the second embodiment can be reduced to ⅔ of that for the conventional apparatus. The apparatus of the second embodiment never produces undesirable particles or dust, which were produced in the conventional apparatus due to up and down movement of the ring-plate part 52b, because the shield member 52 is always stationary. Further, the above-mentioned water-cooled passages 51 provided for the reactor 11 make the shield member 52 cool and therefore the temperature of the inner periphery of the ring-plate part 52b is kept to be 250° C. at most. The film deposition rate at this temperature is 50 Å/min and the film deposition onto the inner periphery of the ring-plate part 52b is totally prevented. This matter contributes to the reduction of contaminating particles.

Further, since the ring-plate part 52b has no up and down moving mechanism as in the second conventional apparatus and therefore the time required for placing the substrate 15 stand still in the reactor 11 is actually reduced by three seconds, the number of substrates to be processed per unit time can be increased by about 0.2. Thus, the productivity for the substrate in the CVD apparatus can be increased.

The technical advantages produced by gas supply passages and the blow-off structure as to the first and second purge gases are such that the differential pressure chuck can make the substrate 15 stably clamped on the substrate holder 13 even if the pressure in the reactor 11 is relatively low, and such that film deposition onto the rear surface of the substrate can be prevented. Namely, although clamping by means of the differential pressure chuck at low pressure equal to 3 Torr e.g. or less is actually apt to be unstable, the above configuration of the second embodiment can decrease the blow-off amount of the first purge gas and increase that of the second purge gas, and therefore further can make the clamping state of the substrate stabilized. Thus, the combination of the first and second purge gases with respect to the blow-off amount can make the substrate clamped stably by utilizing the differential pressure chuck in film deposition (the deposition of initial formation cores) under a low pressure condition.

Further, since the blow-off direction of the second purge gas is designed to be perpendicular to the substrate 15 placed on the substrate holder 13, the reactive gas which approaches and is about to enter into the clearance is repelled toward the blown-off direction by the second purge gas and does not turn back to the side of the substrate, and consequently the film deposition having good distribution on the substrate can be obtained.

The CVD apparatus of the second embodiment can be modified in the same way as the variations of the first embodiment.

What is claimed is:

1. A CVD apparatus comprising:

a reactor;

a substrate holder for holding a substrate on a top surface thereof, which is disposed in said reactor;

an evacuation means for evacuating said reactor;

a reactive gas supply means for supplying a reactive gas into said reactor;

a heating means for heating said substrate holder;

a clamping means for clamping the substrate placed on said substrate holder without pressing the surface thereof to be processed; and a purge gas supply means for supplying purge gas, wherein said substrate holder is configured to have a circular purge gas blowing channel on the top surface thereof, in which a diameter of an outside wall-surface is less than a diameter of the substrate, and a plurality of purge gas passages in an inside thereof, which supply said purge gas introduced by said purge gas supply means into said purge gas blowing channel, whereby said purge gas flows in said purge gas blowing channel and is blown off from a clearance between the outside periphery of the substrate and said substrate holder into said reactor, and further each of said purge gas passages includes a radius-directed part directed in a radius direction of said substrate holder and has a purge gas outlet provided on the outside wall-surface of said purge gas blowing channel.

2. A CVD apparatus as claimed in claim 1, wherein said purge gas blowing channel is formed so that a depth direction thereof is perpendicular to the top surface, and each of said purge gas passages includes an axis-directed part directed in an axis direction of said substrate holder together with said radius-directed part, and further the radius-directed part of said purge gas passage is turned back so as to be connected to said purge gas blowing channel.

3. A CVD apparatus as claimed in claim 1, wherein an end of the radius-directed part of said purge gas passage, which is connected to said purge gas blowing channel, is substantially perpendicular to the outside wall-surface thereof.

4. A CVD apparatus as claimed in claim 1, wherein the purge gas outlet of said purge gas passage is disposed near a bottom section of said purge gas blowing channel.

5. A CVD apparatus as claimed in claim 1, wherein the top surface of said substrate holder has a step between the inside area and the outside area of said purge gas blowing channel.

6. A CVD apparatus as claimed in claim 5, wherein a height of the step is determined so that a blow-off rate of the purge gas blown off from the clearance between said substrate and said substrate holder, which is formed by the step, is included in a range of 50–700 cm/min.

7. A CVD apparatus as claimed in claim 1, wherein on the top surface of said substrate holder the inside area of said purge gas blowing channel is as high as the outside area thereof, and a fine uneven area is formed around said purge gas blowing channel and within a range on the inside of a peripheral edge of the substrate.

8. A CVD apparatus as claimed in claim 1, wherein a ring member placed in the side of an inside wall-surface is disposed in said purge gas blowing channel.

9. A CVD apparatus comprising:

a reactor;

a substrate holder for holding a substrate on a top surface thereof, which is disposed in said reactor;

an evacuation means for evacuating said reactor;

a reactive gas supply means for supplying a reactive gas into said reactor;

a heating means for heating said substrate holder;

a clamping means for clamping the substrate placed on said substrate holder without pressing the surface thereof to be processed; and a purge gas supply means for supplying purge gas, wherein said substrate holder is configured to have a circular purge gas blowing channel on the top surface thereof, in which a diameter of an outside wall-surface is less than a diameter of the substrate, and a plurality of purge gas passages in an inside thereof, which supply said purge gas introduced by said purge gas supply means into said purge gas blowing channel, whereby said purge gas flows in said purge gas blowing channel and is blown off from a clearance between the outside periphery of the substrate and said substrate holder into said reactor, and further each of said purge gas passages includes a radius-directed part directed in a radius direction of said substrate holder and has a purge gas outlet provided on the outside wall-surface of said purge gas blowing channel;

said CVD apparatus further comprising:

a shield member having a ring-plate part covering an outer periphery of the top surface and a cylindrical part covering the side portion of said substrate holder, whereby a purge gas supply passage for supplying a different purge gas is formed around said substrate holder, and said different purge gas is blown off from a clearance between said ring-plate part and said substrate holder.

10. A CVD apparatus as claimed in claim 9, wherein said purge gas blowing channel is formed so that a depth direction thereof is perpendicular to the top surface, and each of said purge gas passages includes an axis-directed part directed in an axis direction of said substrate holder together with said radius-directed part, and further the radius-directed part of said purge gas passage is turned back so as to be connected to said purge gas blowing channel.

11. A CVD apparatus as claimed in claim 9, wherein an end of the radius-directed part of said purge gas passage, which is connected to said purge gas blowing channel, is substantially perpendicular to the outside wall-surface thereof.

12. A CVD apparatus as claimed in claim 9, wherein the purge gas outlet of said purge gas passage is disposed near a bottom section of said purge gas blowing channel.

13. A CVD apparatus as claimed in claim 9, wherein the top surface of said substrate holder has a step between the inside area and the outside area of said purge gas blowing channel.

14. A CVD apparatus as claimed in claim 13, wherein a height of the step is determined so that a blow-off rate of the purge gas blown off from the clearance between said substrate and said substrate holder, which is formed by the step, is included in a range of 50–700 cm/min.

15. A CVD apparatus as claimed in claim 9, wherein on the top surface of said substrate holder the inside area of said purge gas blowing channel is as high as the outside area thereof, and a fine uneven area is formed around said purge gas blowing channel and within a range on the inside of a peripheral edge of the substrate.

16. A CVD apparatus as claimed in claim 9, wherein a ring member placed in the side of an inside wall-surface is disposed in said purge gas blowing channel.

17. A CVD apparatus as claimed in claim 9, wherein a clearance is formed between said ring-plate part and said substrate or said substrate holder.

18. A CVD apparatus as claimed in claim 17, wherein an inner diameter of said ring-plate part is greater than a diameter of said substrate.

19. A CVD apparatus as claimed in claim 17, wherein a distance of said clearance between said ring-plate part and said substrate holder is determined so that a blow-off rate of the purge gas blown off from said clearance is included in a range of 50–700 cm/min.

20. A CVD apparatus comprising:

a reactor;

a substrate holder for holding a substrate on a top surface thereof, which is disposed in said reactor;

an evacuation means for evacuating said reactor;

a reactive gas supply means for supplying a reactive gas into said reactor;

a heating means for heating said substrate holder;

a clamping means for clamping the substrate placed on said substrate holder without pressing the surface thereof to be processed; and a purge gas supply means for supplying purge gas, wherein said substrate holder is configured to have a circular purge gas blowing channel on the top surface thereof, in which a diameter of an outside wall-surface is less than a diameter of the substrate, and a plurality of purge gas passages in an inside thereof, which supply said purge gas introduced by said purge gas supply means into said purge gas blowing channel, whereby said purge gas flows in said purge gas blowing channel and is blown off from a clearance between the outside periphery of the substrate and said substrate holder into said reactor, and further a blow-off direction of the purge gas blown off from a gas outlet of each of said purge gas passages is opposite to a blow-off direction of the purge gas blown off from said clearance at a spot corresponding to the gas outlet.

21. A CVD apparatus as claimed in claim 20, wherein said purge gas blowing channel is formed so that a depth direction thereof is perpendicular to the top surface, and each of said purge gas passages includes a radius-directed part directed in a radius direction of said substrate holder and an axis-directed part directed in an axis direction of said substrate holder, and further the radius-directed part of said purge gas passage is turned back so as to be connected to said purge gas blowing channel.

22. A CVD apparatus as claimed in claim 20, wherein an end of the radius-directed part of said purge gas passage, which is connected to said purge gas blowing channel, is substantially perpendicular to the outside wall-surface thereof.

23. A CVD apparatus as claimed in claim 20, wherein the gas outlet of said purge gas passage is disposed near a bottom section of said purge gas blowing channel.

24. A CVD apparatus as claimed in claim 20, wherein the top surface of said substrate holder has a step between the inside area and the outside area of said purge gas blowing channel.

25. A CVD apparatus as claimed in claim 24, wherein a height of the step is determined so that a blow-off rate of the purge gas blown off from the clearance between said substrate and said substrate holder, which is formed by the step, is included in a range of 50–700 cm/min.

26. A CVD apparatus as claimed in claim 20, wherein on the top surface of said substrate holder the inside area of said purge gas blowing channel is as high as the outside area thereof, and a fine uneven area is formed around said purge gas blowing channel and within a range on the inside of a peripheral edge of the substrate.

27. A CVD apparatus as claimed in claim 20, wherein a ring member placed in the side of an inside wall-surface is disposed in said purge gas blowing channel.

* * * * *